United States Patent [19]
Kim

[11] Patent Number: 5,851,859
[45] Date of Patent: Dec. 22, 1998

[54] METHOD FOR MANFACTURING A THIN FILM TRANSISTOR BY USING TEMPERATURE DIFFERENCE

[75] Inventor: Jeong Hyun Kim, Seoul, Rep. of Korea

[73] Assignee: Goldstar Co., Ltd., Seoul, Rep. of Korea

[21] Appl. No.: 812,535

[22] Filed: Mar. 7, 1997

Related U.S. Application Data

[62] Division of Ser. No. 375,643, Jan. 20, 1995, Pat. No. 5,686,320.

[51] Int. Cl.$^6$ .......................... H01L 21/336; H01L 21/20
[52] U.S. Cl. .......................... 438/158; 438/164; 438/160; 148/DIG. 91; 148/DIG. 93
[58] Field of Search ..................................... 438/158, 164, 438/378, 160, 155, 200, 183, 333, 261

[56] References Cited

U.S. PATENT DOCUMENTS

| | | |
|---|---|---|
| 4,495,218 | 1/1985 | Azuma et al. . |
| 4,569,855 | 2/1986 | Matsuda et al. . |
| 4,585,671 | 4/1986 | Kitagawa et al. . |
| 4,683,147 | 7/1987 | Eguchi et al. . |
| 4,822,751 | 4/1989 | Ishizu et al. . |
| 4,987,008 | 1/1991 | Yamazaki et al. . |
| 5,215,588 | 6/1993 | Rhieu . |
| 5,470,768 | 11/1995 | Yanai et al. ............................. 438/164 |

FOREIGN PATENT DOCUMENTS 60-24126  11/1985  Japan .

*Primary Examiner*—Mary Wilczewski
*Attorney, Agent, or Firm*—John P. White; Copper & Dunham LLP

[57] ABSTRACT

The present invention is related to a method for manufacturing a thin film transistor which can improve the yield, characteristics and reliability of the thin film transistor by selectively forming a semiconductor layer on a desired portion using a of a substrate using a temperature difference of the surface of a substrate achieve by heating the substrate with a lamp. The method comprises the steps of forming a black matrix layer of metal on a portion of the whole surface of an insulating glass substrate, forming an insulating layer for protecting the substrate on the whole substrate including the black matrix layer, forming source/drain electrodes on the insulating layer over the black matrix, selectively forming a semiconductor layer on the insulating layer including the source/drain electrodes, forming a gate insulating layer and forming a gate electrode.

7 Claims, 3 Drawing Sheets

METHOD FOR MANFACTURING A THIN FILM TRANSISTOR BY USING TEMPERATURE DIFFERENCE

This application is a division of U.S. Ser. No. 08/375,643, field Jan. 20, 1995, now U.S. Pat. No. 5,686,320.

BACKGROUND OF THE INVENTION

The present invention relates to a method for manufacturing a thin film transistor and particularly to a method for manufacturing a thin film transistor, which has reduced process steps, by selectively forming semiconductor layer through heat reaction and improves yield and performance of the product.

FIG. 1 is a cross-sectional view of the conventional stagger-type thin film transistor.

The conventional stagger-type transistor comprises a glass substrate 100, source/drain electrodes 101, 102 formed on the glass substrate 100 at a prescribed distance from each other, a semiconductor layer 103 formed across the source/drain electrodes 101, 102, a gate insulating layer 104 formed on the semiconductor layer 103 and a gate 105 formed on the gate insulating layer 104.

The method for manufacturing the conventional stagger-type transistor having the structure as described above will be described below referring to the FIGS. 2A–2D.

First, a metal such as chrome (Cr), tantalum (Ta), etc. or a transparent conducting layer (ITO, indium-tin oxide) is deposited on the insulating glass substrate 100 using a sputtering method as illustrated in FIG. 2A.

Then the deposited metal or ITO layer is patterned by photolithography to form source/drain electrodes 101, 102 on the substrate 100 at a prescribed distance from each other.

As shown in FIG. 2B, an amorphous silicon layer 103' and an insulating layer 104' of a prescribed thickness are serially deposited by PECVD (plasma enhanced chemical vapor deposition) method using a mixing gas of $SiH_4$ and $H_2$ on the whole surface of the substrate including the source/drain electrodes 101 and 102.

As shown in FIG. 2C, a semiconductor layer 103 and a gate insulating layer 104 are formed across the source/drain electrodes 101, 102 and on the substrate by successive etching of the insulating layer 104' and the amorphous silicon layer 103'.

A metal such as aluminum (Al), tantalum (Ta), chrome (Cr), etc. is deposited on the whole substrate at a prescribed thickness. A gate electrode 105 is formed on the gate insulating layer 104 by photolithography as shown in FIG. 2D. At last, the conventional stagger-type thin film transistor is obtained.

In the conventional method for manufacturing the stagger-type thin film transistor, the semiconductor layer is formed by using PECVD method at a temperature from 200° C. to 300° C. In this method, since plasma is used, a uniform semiconductor layer on the whole substrate can be manufactured.

However, since photolithography using a photomask for patterning the semiconductor layer in a prescribed pattern is used after the deposition process, the yield is reduced and the thin film characteristic is deteriorated.

Moreover, since semiconductor layer is deposited using the plasma, the lower layers are damaged and this results in deterioration of the thin film transistor characteristics.

SUMMARY OF THE INVENTION

An object of the present invention is to provide a method for manufacturing a thin film transistor, which has reduced process steps, by selectively forming the semiconductor layer only at the desired portion using substrate heating equipment without a separate mask process and improves the yield. This method performance of the products by preventing the damage of the lower layers during the semiconductor layer formation.

To accomplish this object, the present invention provides a method for manufacturing a thin film transistor comprising the steps of: forming a black matrix layer of metal on a portion of the whole surface of an insulating glass substrate; forming an insulating layer for protecting the substrate on the whole substrate including the black matrix layer; forming source/drain electrodes on the insulating layer at a prescribed distance from each other; selectively forming a semiconductor layer on the insulating layer including the source/drain electrodes over the black matrix layer; forming a gate insulating layer on the whole substrate; and forming a gate electrode on a portion of the gate insulating layer between the source/drain electrodes.

Also the method for manufacturing a thin film transistor comprises the steps of: forming a gate on a portion of the whole surface of an insulating glass substrate; forming a gate insulating layer on the whole substrate including the gate; selectively forming a semiconductor layer on the gate insulating layer over the gate; forming an ohmic layer on the gate insulating layer including the semiconductor layer for low resistant contact of source/drain electrodes with the semiconductor layer; forming source/drain electrodes on the ohmic layer except over the gate; and forming a channel through exposing the semiconductor layer between the source/drain electrodes by dry etching the exposed ohmic layer between the source/drain electrodes.

BRIEF DESCRIPTION OF THE DRAWINGS

The above objects and advantages of the present invention will become more apparent by the following detailed description of a preferred embodiment thereof with reference to the attached drawings in which.

DETAILED DESCRIPTION OF THE INVENTION

Figure 1:
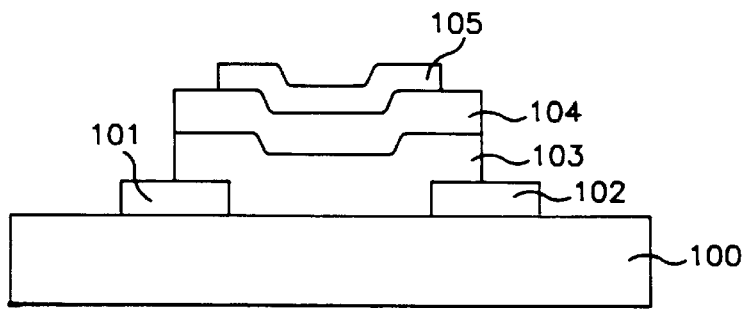
FIG. 1 is a cross-sectional view of the conventional stagger-type thin film transistor.
Figure 2A:
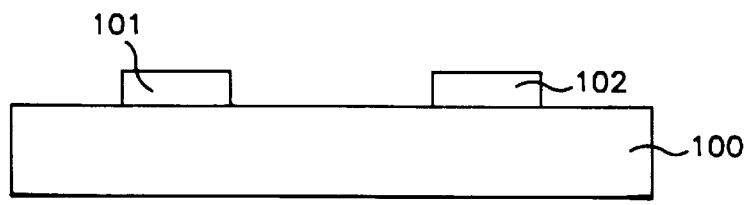
FIGS. 2A–2D are cross-sectional views of the conventional stagger-type thin film transistor of FIG. 1 to illustrate the process for manufacturing the same.
Figure 2B:
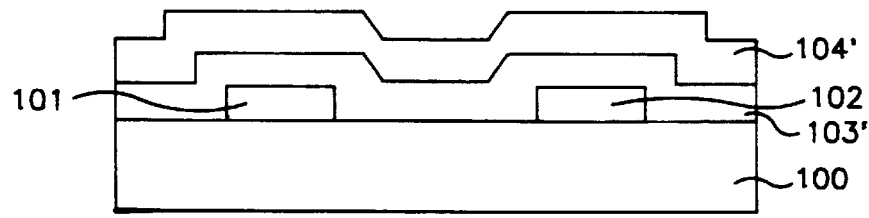
Figure 2C:
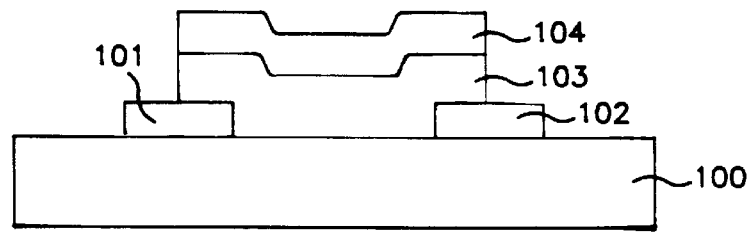
Figure 2D:
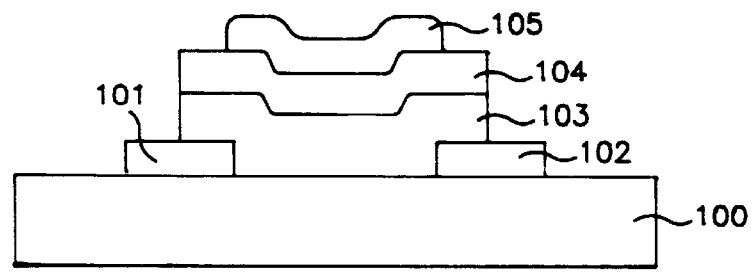
Figure 3:
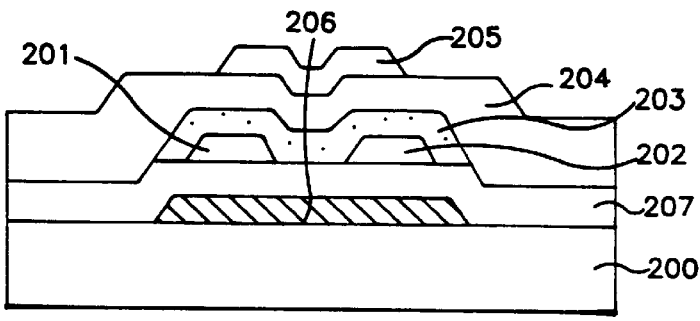
FIG. 3 is a cross-sectional view of a thin film transistor according to an embodiment of the present invention.

FIG. 3 is a cross-sectional view of a thin film transistor according to an embodiment of the present invention, in which the semiconductor layer is formed only over the black matrix layer.

The thin film transistor according to an embodiment of the present invention comprises a glass substrate 200, a black matrix layer 206 formed on a portion of the glass substrate 200, an insulating layer 207 for protecting the substrate formed on the whole substrate including the black matrix layer 206, source/drain electrodes 201, 202 formed on the insulating layer 207 at a prescribed distance from each other, a semiconductor layer 203 formed on the insulating layer including the source/drain electrodes 201,202 over the black matrix layer 206, a gate insulating layer 204 formed on the whole substrate and a gate 205 formed on a portion of the gate insulating layer 204 between the source/drain electrodes 201, 202.

The method for manufacturing the thin film transistor according to an embodiment of the present invention having the above-mentioned structure will be described below referring to FIGS. 4A–4E.

Figure 4A:
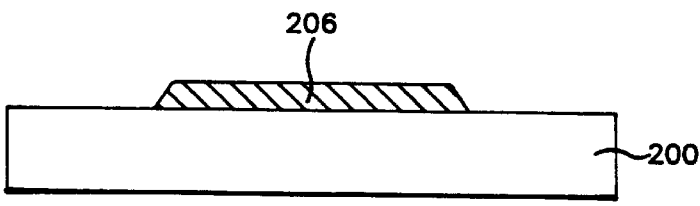
FIGS. 4A–4E are cross-sectional views of the thin film transistor of FIG. 3 which illustrate the process for manufacturing the same.

First, a black matrix layer 206 is formed on a portion of a substrate by sputtering a metal such as aluminum (Al), chrome (Cr), molybdenum (Mo), tantalum (Ta), etc. on an insulating glass substrate 200 and carrying out photolithography as shown in FIG. 4A.

Figure 4B:
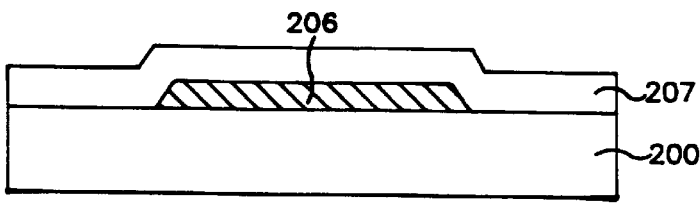

An insulating layer 207 for protecting the substrate is formed by depositing a compound such as $Al_2O_3$, $SiO_x$, SiN, $Ta_xO_2$, etc. on the whole substrate including the black matrix layer as shown in FIG. 4B.

Then, a metal such as chrome (Cr), tantalum (Ta), etc. or a transparent conductive layer (ITO, indium-tin oxide) is deposited on the whole insulating layer 207 by a sputtering method.

Figure 4C:
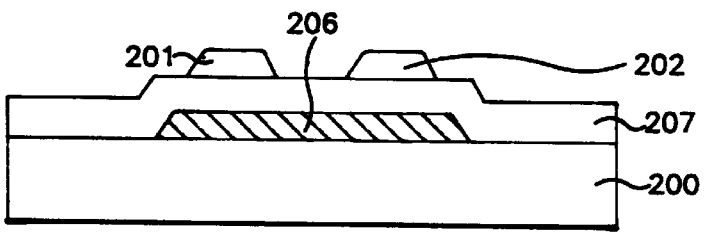

Source/drain electrodes 201, 202 are formed at a prescribed distance from each other on the insulating layer 207 over the black matrix layer 206 by patterning the deposited metal or ITO layer using photolithography as shown in FIG. 4C.

Figure 4D:
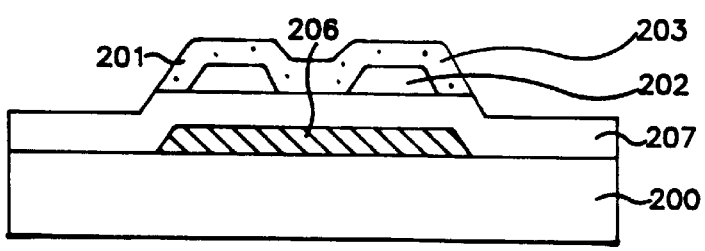

A semiconductor layer 203 is formed by selectively depositing amorphous silicon using APCVD (atmospheric pressure CVD) method with a prescribed thickness on the insulating layer 207 including the source/drain electrodes 201, 202 over the black matrix layer 206 as shown in FIG. 4D.

The substrate is heated by exposing from the backside of the substrate to a substrate heating equipment (a tungsten-halogen lamp or an infrared lamp) when forming the semiconductor layer by selectively depositing the amorphous silicon.

At this time, a temperature difference is generated. That is, a temperature difference between the light transmitting portion, i.e. the portion having no black matrix layer 206 and the light shutting portion, i.e. the portion having the black matrix layer 206 formed thereon, is generated. At this time, the temperature at the light transmitting portion is lower than the light shutting portion by about 30° C. to 60° C.

Accordingly, since the reactivity of the amorphous silicon is higher at the portion of the substrate having higher temperature than at the portion of lower temperature, the amorphous silicon layer is formed relatively rapidly on the portion having the black matrix layer 206 when compared with the portion having no black matrix layer 206. Therefore, the amorphous silicon layer is formed only on the insulating layer 207 over the black matrix layer 206 due to the temperature difference at the surface of the substrate.

According to an experiment, the thickness of the amorphous silicon layer formed on the insulating layer 207 over the black matrix layer was 500 Å, while the thickness of the amorphous silicon layer formed on the insulating 207 having no black matrix layer 206 thereunder was 50 Å due to the temperature difference.

Accordingly, a semiconductor layer is selectively formed on the insulating layer 207 including the source/drain electrodes 201, 202 over the black matrix layer 206 as shown in FIG. 4D.

Figure 4E:
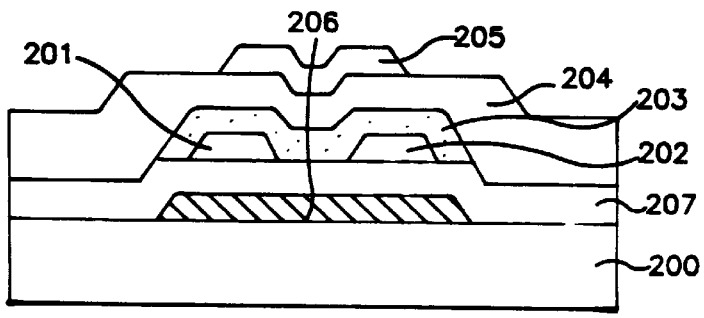

A gate insulating layer 204 is formed by depositing $SiO_x$ or $SiN_x$ using PECVD (plasma enhanced chemical vapor deposition) method utilizing a mixing gas of $SiH_4$ and $H_2$ as shown in FIG. 4E.

Finally, a gate electrode 205 is formed on the gate insulating layer 204 between the source/drain electrodes 201, 202 by depositing a metal such as aluminum (Al), tantalum (Ta), chrome (Cr), etc. at a prescribed thickness and carrying out the photolithography process.

Figure 5:
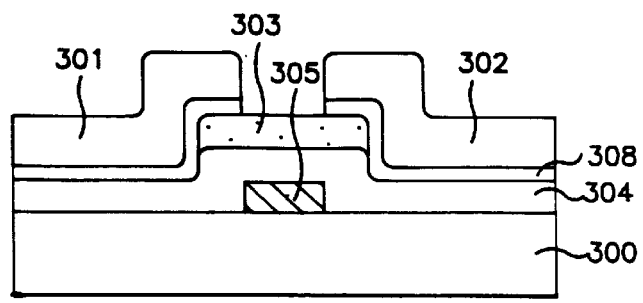
FIG. 5 is a cross-sectional view of a thin film transistor according to another embodiment of the present invention.

FIG. 5 is a cross-sectional view of a thin film transistor according to another embodiment of the present invention in which a semiconductor layer is formed only over the gate electrode.

The thin film transistor according to another embodiment of the present invention comprises a glass substrate 300, a gate 305 formed on a portion of the glass substrate 300, a gate insulating layer 304 formed on the whole substrate including the gate 305, a semiconductor layer 303 formed on the gate insulating layer 304 on the gate 305, source/drain electrodes 301, 302 formed over both sides of the semiconductor layer 303 at a prescribed distance and an ohmic layer 308 formed for low resistant contact of the source/drain electrodes 301, 302 with the semiconductor layer 303.

The method for manufacturing the thin film transistor according to another embodiment of the present invention having the above-mentioned structure will be described below referring to FIGS. 6A–6E.

Figure 6A:
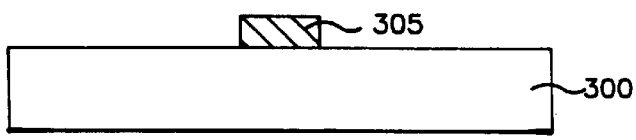
FIGS. 6A–6E are cross-sectional views of the thin film transistor of FIG. 5 which illustrate the process for manufacturing the same.

First, a gate 305 is formed on a portion of a substrate by depositing a metal such as aluminum (Al), chrome (Cr), molybdenum (Mo), tantalum (Ta), MoTa, etc. on the whole insulating glass substrate and carrying out photolithography as shown in FIG. 6A.

Figure 6B:
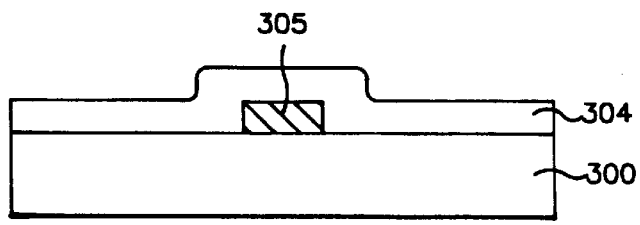

A gate insulating layer 304 is formed by depositing a compound such as $Al_2O_3$, $SiO_x$, SiN, $Ta_xO_2$, etc. on the whole substrate, including the gate 305, with a 2500 to 3500 Å thickness as shown FIG. 6B.

Figure 6C:
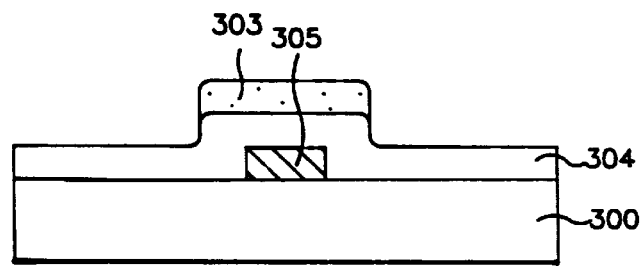

A semiconductor layer 303 is formed by selectively depositing amorphous silicon over the gate insulating layer 304 on the gate 305 at a prescribed thickness by CVD method as shown in FIG. 6C.

When forming the semiconductor layer by selectively depositing the amorphous silicon, the substrate at the portion where metal pattern is formed, that is, where the gate is formed is exposed to the light from the backside of the substrate using substrate heating equipment such as a tungsten-halogen lamp or an infrared lamp so that the temperature at this portion of the substrate becomes 400° C. to 430° C.

Accordingly, if the light is exposed from the backside of the substrate, the light transmits at the portion where the metal pattern is not formed, that is, where the gate is not formed, while the light is absorbed or reflected at the portion where the metal pattern is formed, that is, where the gate is formed.

Therefore, the temperature difference generated between the portion where the light transmits and the portion where the light is shut is about 30° C. to 60° C.

As described above, if the temperature at the portion of the substrate where the metal pattern is formed reaches to a prescribed temperature during heating using the substrate heating equipment, the pressure in the thin film deposition equipment is adjusted to 350 torr or higher using hydrogen ($H_2$) gas or helium (He) gas. At this time, if the pressure in the equipment exceeds 350 torr and silane gas ($SiH_4$, $Si_2H_6$, $Si_3H_8$) is injected, the injected gas decomposes at the surface of the substrate and is deposited on the surface of the substrate.

Here, at the substrate where the metal pattern is formed, the surface temperature is 400° C. or more and a thin film is formed by the gas reaction at the surface as shown in FIG. 6C. However, at the substrate where the metal pattern is not formed, the surface temperature is 380° C. or less resulting in low gas decomposition and, therefore very slow formation of the thin film. Ultimately, the semiconductor layer 303 consisting of the amorphous silicon is selectively formed only over the gate 305.

From the experimental result, when a semiconductor is formed using the temperature difference, an amorphous silicon layer having a thickness of 400 to 500 Å is formed over the gate 305, while an amorphous silicone layer having a thickness of 70 Å and less is formed on the gate insulating layer 304 where the gate 305 is not formed thereunder.

That is, the semiconductor layer having a thickness of 300 Å or more, which is the minimum thickness for playing the role of a semiconductor in a switching device, can be manufactured by means of the above-mentioned selective deposition method of the present invention.

Here, since the deposition temperature is 350° C. or over, and so the deposited silicone layer 303 does not contain hydrogen, the amorphous silicon layer is hydrogen treated by forming plasma or using filament to manufacture a semiconductor layer consisting of a hydrogenated amorphous silicon layer.

Therefore, the semiconductor layer 303 consisting of the hydrogenated amorphous silicon layer can be formed on the gate 305 without carrying out separate mask process or photolithography.

Figure 6D:
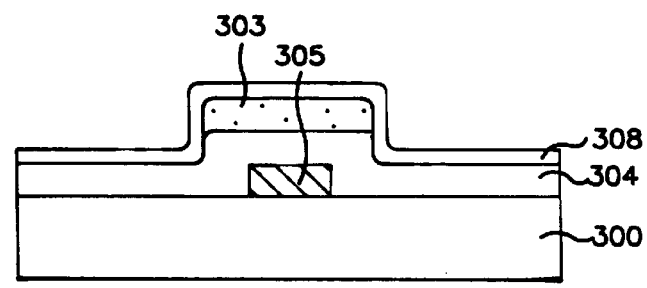

An ohmic layer 308 consisting of an impurity doped amorphous silicone layer is formed by PECVD method using $PH_3$, $SiH_4$ and $H_2$ gas having a thickness of 700 Å or less for low resistant contact with the semiconductor layer 303, as shown in FIG. 6D.

Figure 6E:
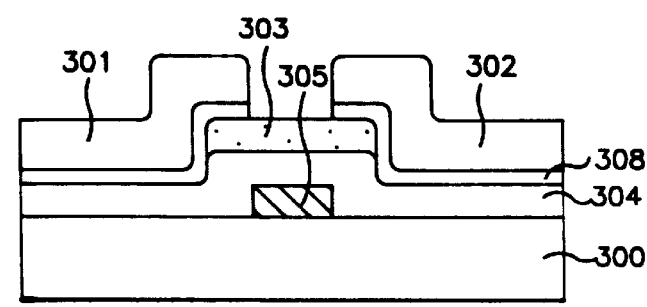

Source/drain electrodes 301, 302 are respectively formed on the ohmic layer 308 at a constant distance by depositing a metal on the ohmic layer 308 and patterning the metal using a mask for patterning the source/drain electrodes. Then a channel is formed by exposing the semiconductor layer 303 between the source/drain electrodes 301, 302 by dry etching the exposed ohmic layer 308 between the source/drain electrodes 301, 302. Thus the thin film transistor of the present invention is formed, as shown in FIG. 6E.

As described above, the semiconductor layer can be selectively formed only at the desired position through heat reaction using a substrate heating equipment, instead of by the conventional PECVD method. Therefore, separate mask process and photolithography are not needed to form the semiconductor layer. And, accordingly, the number of steps can be reduced and yield can be enhanced by preventing the damage to the lower layer by particles or ions. At the same time, the yield and reliability of the thin film transistor can be improved.

What is claimed is:

1. A method for forming a thin film transistor, comprising the steps of:

a) providing a substrate;

b) patterning a gate electrode on the substrate;

c) forming an insulating layer on the substrate including the gate electrode;

d) selectively depositing a semiconductor layer on the insulating layer over the gate electrode by heating the substrate with a lamp; and e) patterning a source electrode and a drain electrode on the insulating layer to contact the semiconductor layer.

2. A method as claimed in claim 1, wherein step d) is conducted using APCVD.

3. A method as claimed in claim 1, wherein the semiconductor layer formed on the surface of the insulating layer over the gate electrode is thicker than the semiconductor layer formed on the other surface of the insulating layer.

4. A method as claimed in claim 3, wherein the semiconductor layer formed on the surface of the insulating layer over the gate electrode is ten times thicker than the semiconductor layer formed on the other surface of the insulating layer.

5. A method as claimed in claim 1, wherein the lamp is a tungsten-halogen lamp.

6. A method as claimed in claim 1, wherein the lamp is an infrared lamp.

7. A method as claimed in claim 1, wherein step d) includes exposure of the substrate to the lamp from the backside of the substrate.

* * * * *